United States Patent
Saghi et al.

(10) Patent No.: US 8,745,457 B2
(45) Date of Patent: Jun. 3, 2014

(54) METHODS AND STRUCTURE FOR UTILIZING EXTERNAL INTERFACES USED DURING NORMAL OPERATION OF A CIRCUIT TO OUTPUT TEST SIGNALS

(75) Inventors: Eugene Saghi, Colorado Springs, CO (US); Paul J. Smith, Colorado Springs, CO (US); Joshua P. Sinykin, Shrewsbury, MA (US); Jeffrey K. Whitt, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 39 days.

(21) Appl. No.: 13/434,954

(22) Filed: Mar. 30, 2012

(65) Prior Publication Data
US 2013/0257512 A1    Oct. 3, 2013

(51) Int. Cl.
*G01R 31/28* (2006.01)

(52) U.S. Cl.
USPC ......................................................... 714/734

(58) Field of Classification Search
None
See application file for complete search history.

(56) References Cited

U.S. PATENT DOCUMENTS

| | | | |
|---|---|---|---|
| 5,317,711 A * | 5/1994 | Bourekas et al. | 714/47.1 |
| 5,500,853 A * | 3/1996 | Engdahl et al. | 370/252 |
| 5,936,876 A * | 8/1999 | Sugasawara | 365/51 |
| 5,978,942 A * | 11/1999 | Rockoff | 714/724 |
| 6,182,247 B1 * | 1/2001 | Herrmann et al. | 714/39 |
| 6,687,865 B1 * | 2/2004 | Dervisoglu et al. | 714/726 |
| 7,322,000 B2 | 1/2008 | Colunga et al. | |
| 7,496,474 B2 * | 2/2009 | Browen et al. | 702/183 |
| 7,587,643 B1 | 9/2009 | Chopra | |
| 7,620,862 B1 * | 11/2009 | Lai | 714/725 |
| 2005/0044460 A1 | 2/2005 | Hoglund et al. | |
| 2007/0035321 A1 | 2/2007 | Gorodetsky et al. | |
| 2008/0052574 A1 * | 2/2008 | Smith et al. | 714/724 |
| 2011/0131351 A1 * | 6/2011 | Noeldner et al. | 710/52 |
| 2011/0289180 A1 * | 11/2011 | Sonnier et al. | 709/213 |

* cited by examiner

*Primary Examiner* — Daniel McMahon
(74) *Attorney, Agent, or Firm* — Duft Bornsen & Fettig

(57) ABSTRACT

Methods and structure are provided for routing internal operational signals of a circuit for output via an external interface. The structure includes an integrated circuit. The integrated circuit comprises a block of circuitry components operable to generate internal operational signals for performing designated functions during normal operation of the circuit, a control unit, a test signal routing hierarchy, and an external interface. The test signal routing hierarchy is coupled to receive the internal operational signals and controllably selects the internal operational signals for acquisition and applies them to the control unit. The external interface provides communications between the integrated circuit and an external device during normal operation of the integrated circuit. The control unit receives the selected internal operational signals from the test signal routing hierarchy, and applies the selected internal operational signals to the external interface during normal operation of the integrated circuit.

18 Claims, 3 Drawing Sheets

METHODS AND STRUCTURE FOR UTILIZING EXTERNAL INTERFACES USED DURING NORMAL OPERATION OF A CIRCUIT TO OUTPUT TEST SIGNALS

BACKGROUND

1. Field of the Invention

The invention relates generally to integrated circuits and more specifically relates to testing internal operational signals of an integrated circuit.

2. Discussion of Related Art

Electronic circuits perform a wide variety of designated functions for electronic systems. For example, integrated circuits may be used for data processing, data storage and retrieval, system analysis and control, and many other functions. Integrated circuits may be subject to programming, design, or operational errors, and internal operational signals are not exposed for acquisition by external devices during normal operation (i.e., they are internal to the circuit). It would be impractical or impossible to connect every internal operational signal to its own dedicated output pin of the circuit for monitoring purposes. As such, it is desirable not only to include logic in the circuit that performs the circuit's desired function, but also to include logic and components at the circuit for acquiring internal signals for debugging and testing purposes (e.g., for externally monitoring internal operational signals of the circuit). For example, the circuit may include a test signal routing hierarchy comprising test multiplexers (MUXs) having registers that can be programmed to select internal operational signals for routing through the test MUXs. The test MUXs provide the selected internal operational signals to test outputs (e.g., specialized General Purpose Input Output (GPIO) pins) for the circuit that are dedicated for debug purposes. Utilizing MUXs to output test signals that are normally internal to the circuit ensures that the cost and size of a circuit implementing testing logic is reduced, because MUXs allow a large number of internal signaling pathways to be condensed into a much smaller number of output signal paths. These test signal output paths may be monitored by a logic analyzer to acquire the selected internal operational signals.

Unfortunately, dedicated test signal output paths are expensive and occupy valuable space upon the die of an integrated circuit. Thus, circuit designers must constantly decide between building a circuit that is easier to debug, and building a circuit that is cheaper to manufacture. These conflicting goals cause continuing problems in the field of circuit design.

Thus it is an ongoing challenge to provide acquired internal operational signals in a manner that is effective yet at the same time reduces the expense of dedicated test signal output paths.

SUMMARY

The present invention addresses the above and other problems, thereby advancing the state of the useful arts, by providing methods and structure for using test signal routing hierarchies of a circuit to acquire internal operational signals and apply them to external interfaces used for communications during normal operation of the circuit. Furthermore, the acquired signals may be provided even while the external interface is managing communications performed during normal operation of the circuit.

In one aspect hereof, a method is provided. The method comprises generating, at an integrated circuit, internal operational signals for performing designated functions. The method also comprises selecting, via a control unit of the circuit, the internal operational signals for acquisition via a test signal routing hierarchy of the circuit. Further, the method includes acquiring, via the test signal routing hierarchy, the selected internal operational signals. Additionally, the method includes selecting, via the control unit of the circuit, an external interface operable to provide communications between the integrated circuit and an external device during normal operation of the circuit. Also, the method includes applying the selected internal operational signals to the external interface during normal operation of the circuit.

Another aspect hereof provides an integrated circuit. The integrated circuit comprises a block of circuitry components operable to generate internal operational signals for performing designated functions during normal operation of the circuit, a control unit, a test signal routing hierarchy, and an external interface. The test signal routing hierarchy is coupled to receive the internal operational signals and is controllably operable to select the internal operational signals for acquisition and to apply them to the control unit. The external interface is operable to provide communications between the integrated circuit and an external device during normal operation of the integrated circuit. The control unit is operable to receive the selected internal operational signals from the test signal routing hierarchy, and is operable to apply the selected internal operational signals to the external interface during normal operation of the integrated circuit.

DETAILED DESCRIPTION OF THE DRAWINGS

Figure 1:
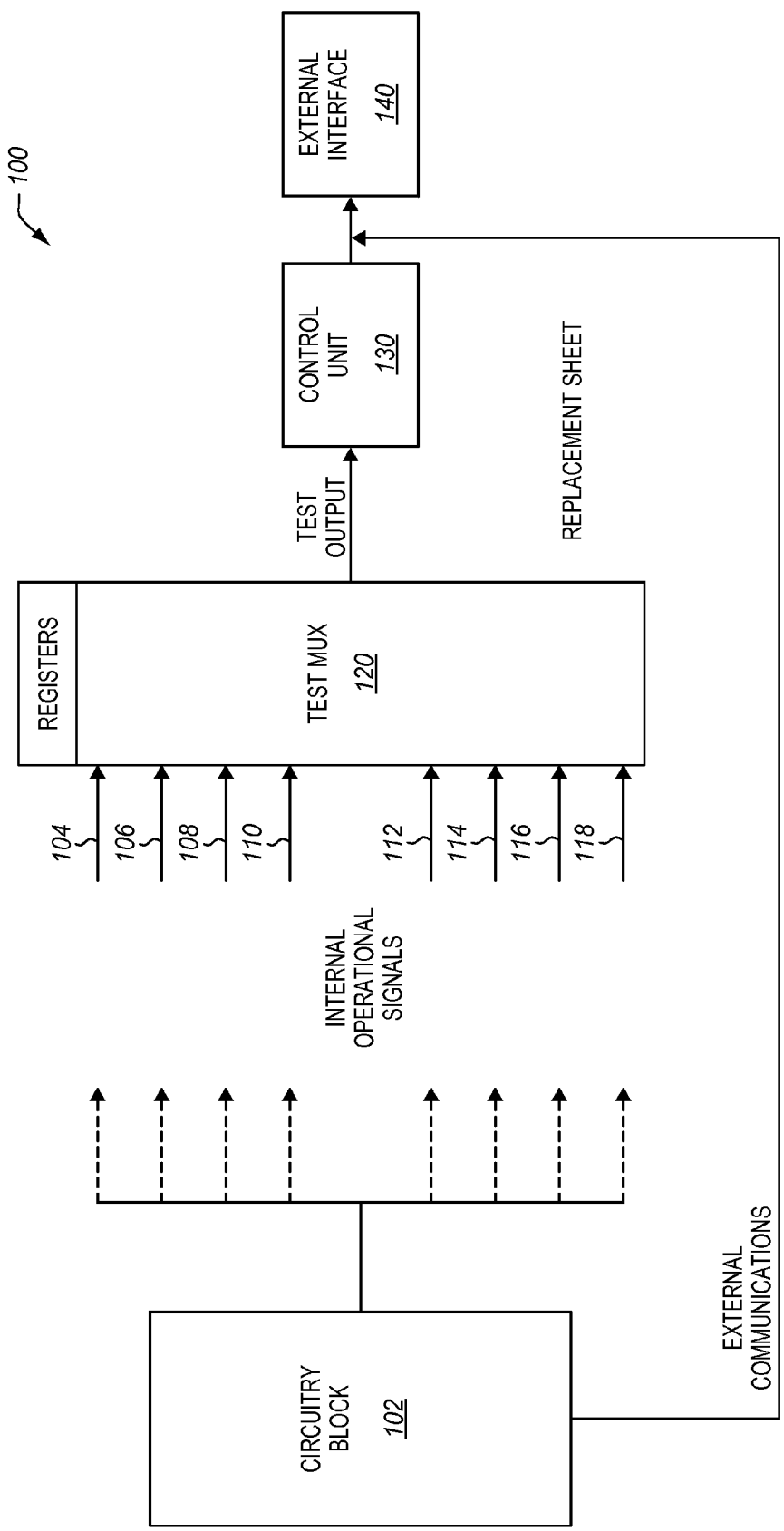
FIG. 1 is a block diagram of an exemplary integrated circuit in accordance with features and aspects hereof.

FIG. 1 is a block diagram of an exemplary integrated circuit 100 in accordance with features and aspects hereof. Integrated circuit 100 has been enhanced so that internal operational signals may be routed to external interfaces of the circuit that are not dedicated exclusively for debugging and testing. For example, the internal operational signals may be hidden among the normal communications of the external interface while the integrated circuit is performing its normally designated functions. Thus, internal operational signals can be acquired and provided to an external test analyzer without requiring the addition of a dedicated test output.

Integrated circuit 100 comprises any integrated circuit operable to perform a number of designated functions. As integrated circuits vary wildly depending on their intended use (e.g., operating a computer, managing braking force applied to wheels of a car, managing a data storage system, etc.), it would be impossible to provide a full list of exemplary designated functions. However, it should be appreciated that designated functions comprise the intended functions of the circuit during its normal operations—e.g., the functions of the circuit while the circuit is not in a testing mode.

In this embodiment, integrated circuit 100 includes circuitry block 102, which performs the designated functions of the circuit and generates internal operational signals as a part of performing those designated functions. Internal operational signals generated at circuitry block 102 are different from other operational signals in that these signals are not applied at an external output for application to connected devices. Rather, the internal operational signals are used to manage the internal operations of circuitry block 102. Thus, internal operational signals are distinct from those signals generated at circuitry block 102 that are provided to external devices.

Examples of internal operational signals may include internal timers, clock pulses, counters, etc. that are used to direct the operations of various circuitry components, but not intended for distribution outside of circuitry block 102.

Circuitry block 102 itself may comprise any number of circuit components arranged in any manner. The number of circuitry blocks and layout of circuitry blocks at circuit 100 may of course vary as a matter of design choice. However, circuitry block 102 is capable of generating internal operational signals 104-118 and applying them to a test signal routing hierarchy (here, depicted as a single test multiplexer (MUX) 120).

The test signal routing hierarchy comprises any combination of circuitry components operable to route received internal operational signals to control unit 130. For example, the test signal routing hierarchy may comprise multiple MUXs, crosspoint switches, etc. Each of these components may, responsive to receiving a selection signal, alter internal selection registers in order to route different signals out to control unit 130. As integrated circuits of today may utilize millions of internal operational signals that a user may wish to monitor, a person having ordinary skill in the art will appreciate that test MUX 120 represents an extremely simplified version of an exemplary test signal routing hierarchy.

Control unit 130 comprises any system, component, or device operable to receive test output comprising internal operational signals, and to provide that output along an external interface 140 used to facilitate communications between circuit 100 and an external device during normal operations of circuit 100. Control unit 130 is further operable to provide the output during normal operations of circuit 100 (e.g., communications related to the designated functions of circuit 100 may remain ongoing via external interface 140). Control unit 130 may be implemented, for example, as custom circuitry, as a special or general purpose processor executing programmed instructions stored in an associated program memory, or some combination thereof.

External interface 140 comprises any system, component, or device operable to facilitate communications between circuit 100 and an external device. External interface 140 may comprise any of countless electronic or optical interfaces. For example, external interface 140 may comprise a Serial Attached SCSI (SAS) interface, a Peripheral Component Interconnect (PCI) interface, a Random Access Memory (RAM) interface, a Serial Advanced Technology Attachment (SATA) interface, a Universal Serial Bus (USB) interface, etc.

Note that the particular arrangement of components described herein is merely intended to be exemplary, and one of ordinary skill in the art will appreciate that the specific arrangement and configuration of circuit components is merely a matter of design choice.

While in operation, integrated circuit 100 is operable to acquire internal operational signals via test MUX 120, and is further operable to apply the acquired internal operational signals to external interface 140 during normal operations of the circuit. In this manner, live testing of integrated circuit 100 may be performed while integrated circuit 100 is performing its designated functions. Thus, there is no need for a dedicated testing output at integrated circuit 100, which in turn means that the cost and complexity of integrated circuit 100 are reduced. Furthermore, integrated circuit 100 may be tested in an operating environment without substantially interrupting the performance of its designated functions.

Figure 2:
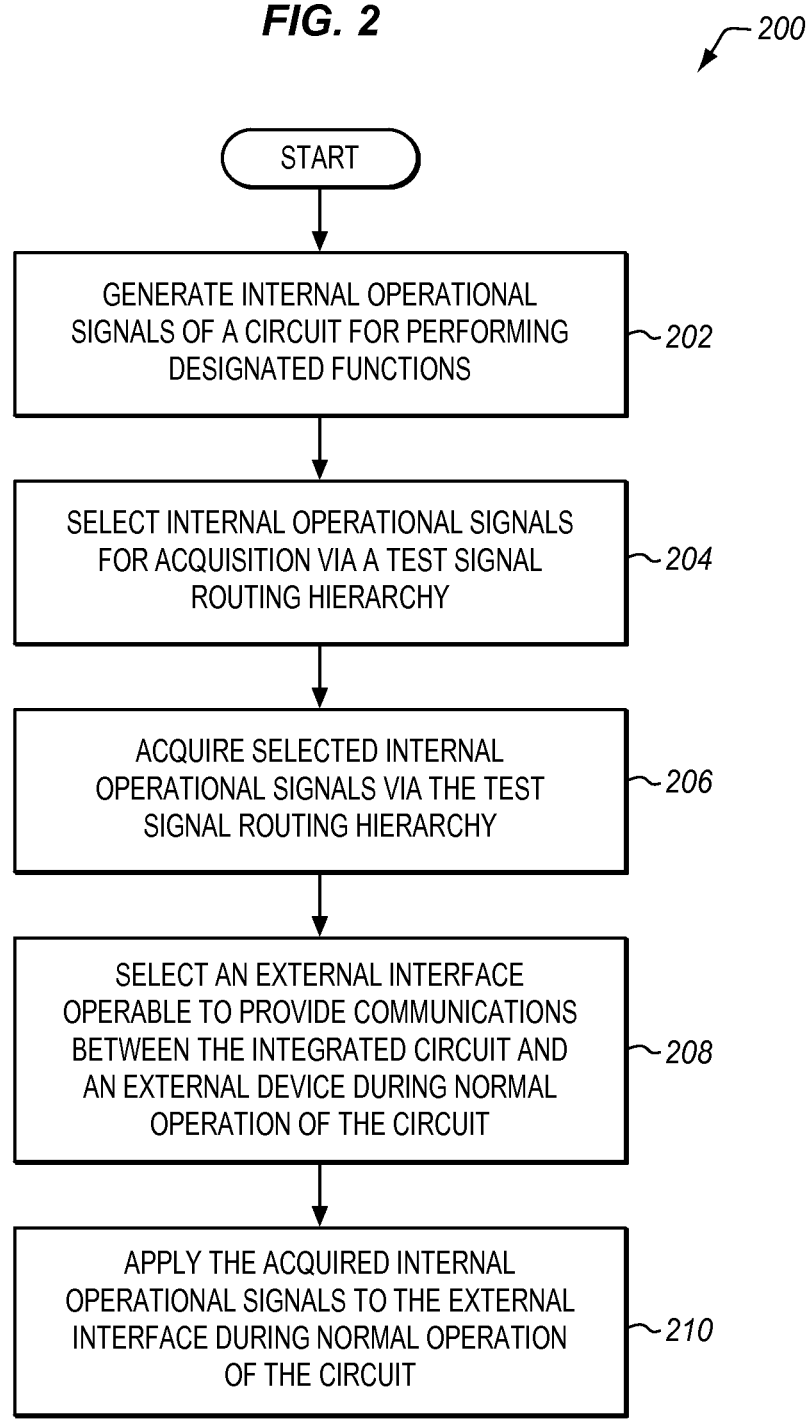
FIG. 2 is a flowchart describing an exemplary method in accordance with features and aspects hereof to provide internal operational signals via an external interface.

FIG. 2 is a flowchart describing an exemplary method 200 in accordance with features and aspects hereof to provide internal operational signals via an external interface. The method of FIG. 2 may be operable in an integrated circuit such as described above with regard to FIG. 1.

Step 202 of method 200 comprises generating internal operational signals used to perform designated functions of a circuit. The internal operational signals are generated at a circuitry block of the integrated circuit, and are generated during normal operations of the circuit (i.e., the signals are not generated during a dedicated testing mode for the circuit, but are rather generated in order to fulfill the circuit's intended purpose when used by an end user).

Step 204 comprises selecting internal operational signals for acquisition via a test signal routing hierarchy. This is performed via a control unit of the integrated circuit. This step may comprise, for example, programming registers and other components of the test signal routing hierarchy in order to ensure that selected signals are routed to proper outputs. The selection of internal signals may be triggered by an internally generated event at the circuit, or may be externally triggered based upon input received from a user wishing to test the circuit.

In some embodiments, once the appropriate internal operational signals have been selected for acquisition, the circuit may await a triggering event before commencing monitoring of the internal operational signals. There may be a number of reasons for this. For example, the selected internal operational signals may be relevant only in regard to their characteristics during/after a specific electronic event at the circuit has occurred. As such, there may be no need to acquire the selected signals for application to an external interface of the circuit until after the event has occurred.

Step 206 comprises acquiring the selected internal operational signals via the test signal routing hierarchy. Acquiring the selected signals may comprise, for example, storing the selected signals in a buffer or other memory in a format from which they may be reconstructed. For example, storing the signals in memory may provide the integrated circuit with sufficient time to package or wrap the signals in communications that match a protocol supported by an external interface of the circuit.

Step 208 comprises selecting an external interface operable to provide communications between the integrated circuit and an external device during normal operation of the circuit. The external interface may be selected because it is the only external interface at the integrated circuit, or if multiple external interfaces exist at the integrated circuit, the appropriate interface may be selected based upon a number of criteria. For example, if an interface uses signals that are generated based upon the selected internal operational signals, it may not be desirable to use the interface, because using the interface may subtly interfere with the stimulus-response characteristics of the circuit. For example, if the interface is a SAS interface, inserting the acquired internal operational signals into the communications may delay other communications intended for transmission. Thus, the circuit would appear to be responding more sluggishly than it actually would if testing were not occurring. A number of other criteria may be used to select an appropriate external interface. For example, if the interface is currently experiencing a heavy data traffic load, it may be desirable to select another interface in order to avoid further burdening the communications traffic. In a further example, certain interfaces (e.g., serial vs. parallel interfaces, interfaces having minimal latency, etc.) may be more desirable to use in order to provide acquired test data because they may be more well suited to providing the test data in a manner that is fast and yet doesn't interfere with the operations of the circuit. In a further example, interfaces supporting a faster data rate may be more desirable than other interfaces supporting a slower data rate.

In step 210, the circuit applies the acquired internal operational signals to the external interface of the circuit during normal operation of the circuit. Thus, no dedicated output is required for testing at the circuit. Furthermore, even as the circuit is performing its designated functions and operating in a manner desired by an end-user, it may provide test signals for debug purposes. Applying the internal operational signals may take a number of forms depending upon the type of signals applied to the external interface as well as the type of interface used. For example, a control unit of the circuit may package or wrap the signals in an envelope/wrapper and place the signals inside of a communication generated for the external interface before the signals are transmitted to an external device. For example, the wrapper may be compliant with the communication protocol utilized by the external interface.

Using a wrapper may ensure that the external interface does not alter the acquired signals, and may provide an added benefit that, when properly tagged, the acquired signals may be quickly and effectively extracted for analysis. Additionally, using a wrapper/envelope ensures that the external interface does not need to be altered in order to support providing the acquired internal operational signals to the external device.

Using a wrapper may mean that the internal operational signals should be re-assembled into a readable form before analysis can occur. However, this re-assembly is generally a fairly minor processing operation. Thus, although a potential penalty is encountered in that the signals are not reviewed for analysis at exactly the same time as they have occurred within the circuit, the signals may be reconstructed after a brief delay in order to show the circuit's time-response to a given stimulus.

In a further embodiment, a control unit of the circuit may be operable to compress the selected internal operational signals before inserting them among the communications. This results in a processing delay in interpreting the received signals, but provides a benefit in that the external interface is not utilized as heavily as when it is used to carry uncompressed instructions.

In a further embodiment, the control unit is further operable to package the selected internal operational signals inserted among the communications by tagging the selected signals as non-communication content. For example, these signals may be wrapped in communications that are tagged as vendor-specific messages, comments, or other categories of communication not typically processed during normal operations of the external device. Thus, the communications may be ignored when received by circuitry of the external device that directs the normal operations of the external device, yet still may be retrieved by components dedicated to testing/debugging.

In one example, the external interface comprises a Peripheral Component Interconnect-Express (PCI-E) protocol compliant interface operable to perform PCI-E communications. The control unit therefore generates Vendor-Defined Type 1 messages in which to insert the selected internal operational signals. A component of the external device (or a device coupled with the external device, or coupled with a communication channel linking the external device to the external interface) is then capable of identifying the Vendor-Defined Type 1 messages, extracting the internal operational signals, and determining the state of the internal operational signals over time.

In another example, the external interface comprises a Random Access Memory (RAM) interface. The control unit is further operable to insert the selected internal operational signals among the communications by directing the external interface to write the selected signals to a pre-allocated segment of the RAM. A component of the external device (or a device coupled with the external device, or coupled with a communication channel linking the external device to the external interface) is then capable of identifying the pre-allocated segment of RAM, extracting the internal operational signals, and determining the state of the internal operational signals over time.

In another example, the external interface comprises a Serial Attached SCSI (SAS) protocol compliant interface operable to perform SAS communications. The control unit is further operable to generate Serial Management Protocol (SMP) commands in which to insert the selected internal operational signals. A component of the external device (or a device coupled with the external device, or a device coupled with a communication channel linked to the external interface) is then capable of identifying the SMP commands, extracting the internal operational signals, and determining the state of the internal operational signals over time.

In another example wherein the external interface comprises a Serial Attached SCSI (SAS) protocol compliant interface operable to perform SAS communications, the control unit is further operable to generate Serial SCSI Protocol (SSP) send/receive diagnostic commands in which to insert the selected operational signals. Such SSP commands could be sent to a specific SSP target in the domain for later extraction. For example, a certain reserved space unavailable to an operating system may be used to acquire and store the selected internal operational signals. In another embodiment, the SSP commands could be acquired by a SAS protocol analyzer based upon the type of SSP command that it is, or the SSP target indicated in the command.

In another example, the control unit comprises a First In First Out (FIFO) buffer for temporarily storing received internal operational signals, and the control unit is further operable to route signals stored at the FIFO to the external interface. In this manner, if the signal changes too rapidly for each change of the signal to be independently reported by the external interface, the changes may be tracked at the FIFO for later transmission (e.g., the FIFO may allow the changes to the internal operational signals to be sent out as a batch of changes periodically, or may simply store the changes for later transmission when the external interface is less busy).

In a further embodiment, the control unit comprises multiple First In First Out (FIFO) buffers for temporarily storing received internal operational signals, and the control unit is further operable to utilize multi-buffering techniques at the FIFOs to route the stored signals from the FIFO buffers to the external interface. This may allow for the signals to be provided more quickly from the FIFO buffers to the external interface.

Figure 3:
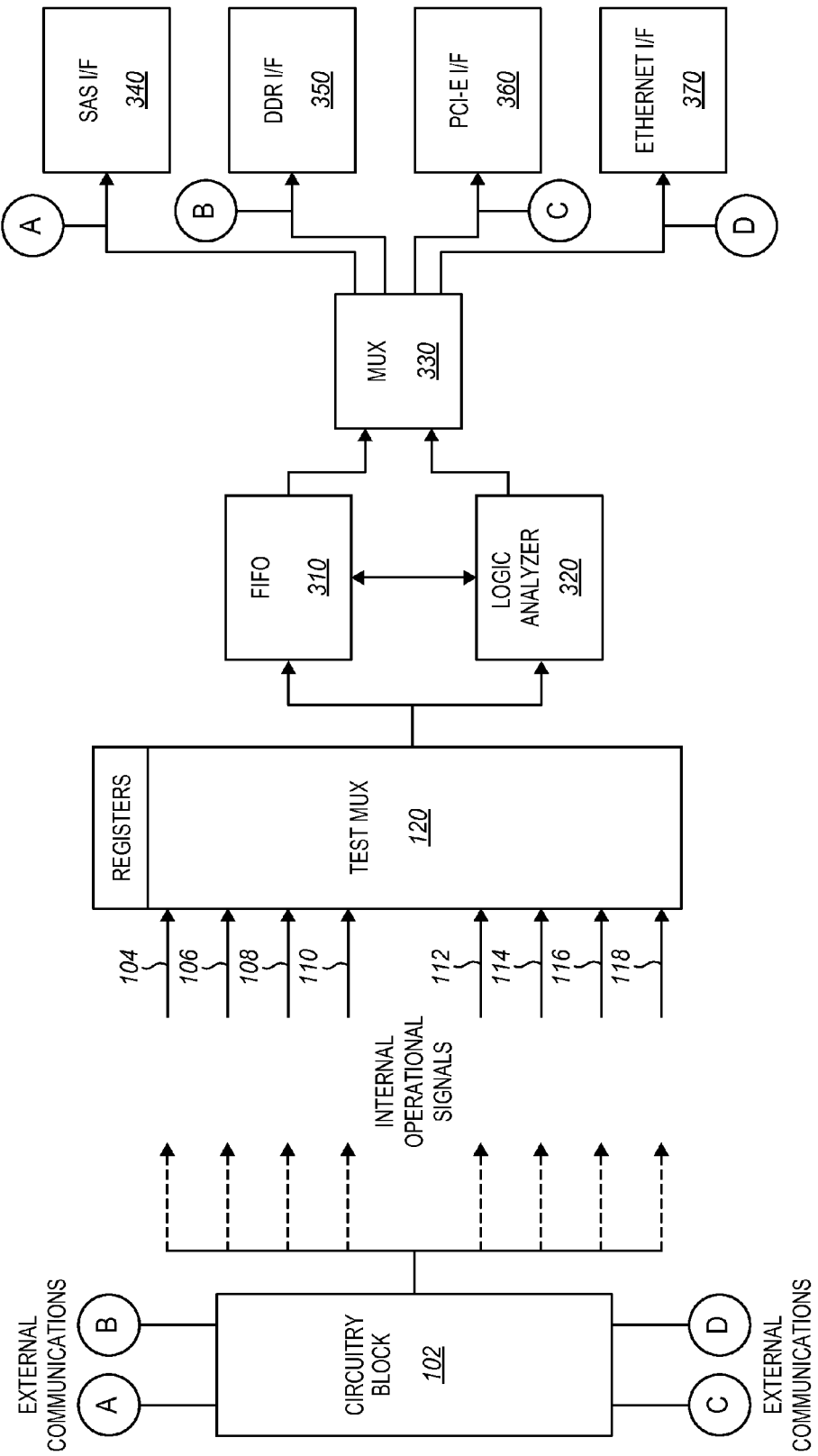
FIG. 3 is a block diagram illustrating a further exemplary integrated circuit in accordance with features and aspects hereof.

FIG. 3 is a block diagram illustrating a further exemplary integrated circuit in accordance with features and aspects hereof. According to FIG. 3, an integrated circuit (e.g., integrated circuit 100 of FIG. 1) includes FIFO 310 for temporarily storing received signals, as well as logic analyzer 320 which is operable to analyze the received signals and generate an output based upon its analysis. MUX 330 is operable to multiplex the outputs of FIFO 310 and logic analyzer 320 and to apply the outputs to an external interface for review. These external interfaces include SAS interface 340, Double Data Rate (DDR) RAM interface 350, PCI-E interface 360, and Ethernet interface 370. The selection of which interface to utilize may be hard-coded into MUX 330, or may be dynamically programmed depending upon criteria such as those discussed above.

While the invention has been illustrated and described in the drawings and foregoing description, such illustration and description is to be considered as exemplary and not restrictive in character. One embodiment of the invention and minor variants thereof have been shown and described. In particular, features shown and described as exemplary software or firmware embodiments may be equivalently implemented as customized logic circuits and vice versa. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An integrated circuit comprising:
a block of circuitry components operable to generate internal operational signals for performing designated functions during normal operation of the integrated circuit;
a control unit;
a test signal routing hierarchy coupled to receive the internal operational signals, the test signal routing hierarchy operable to select the internal operational signals for acquisition and to apply them to the control unit; and
an external interface operable to provide communications between the integrated circuit and an external device during normal operation of the integrated circuit,
the control unit operable to receive selected internal operational signals from the test signal routing hierarchy, operable to apply the selected internal operational signals to the external interface during normal operation of the integrated circuit, and operable to insert the selected internal operational signals among the communications provided during normal operation of the integrated circuit.

2. The integrated circuit of claim 1 wherein:
the designated functions of the integrated circuit are unrelated to testing internal operations of the integrated circuit,
applying the selected internal operational signals to the external interface does not interrupt the designated functions of the integrated circuit, and
the internal operational signals comprise signals that are routed to the external interface exclusively via the test signal routing hierarchy.

3. The integrated circuit of claim 1 wherein:
the control unit is further operable to compress the selected internal operational signals before inserting them among the communications.

4. The integrated circuit of claim 1 wherein:
inserted internal operational signals are packaged inside of a wrapper compliant with a communication protocol utilized by the external interface.

5. The integrated circuit of claim 1 wherein:
the control unit is further operable to package the selected internal operational signals inserted among the communications by tagging the selected internal operational signals as non-communication content.

6. The integrated circuit of claim 1 wherein:
the integrated circuit further comprises multiple external interfaces; and
the control unit is further operable to select an external interface for inserting the selected internal operational signals, based upon an amount of data traffic for each external interface.

7. The integrated circuit of claim 1 wherein:
the integrated circuit further comprises multiple external interfaces; and
the control unit is further operable to select an external interface for inserting the selected internal operational signals.

8. The integrated circuit of claim 1 wherein:
the integrated circuit further comprises multiple external interfaces; and
the control unit is further operable to select an external interface for inserting the selected internal operational signals based upon an amount of internal operational signals selected and a data rate of each external interface.

9. The integrated circuit of claim 1 wherein:
the external interface comprises a Serial Attached SCSI (SAS) protocol compliant interface operable to perform SAS communications, and
the control unit is further operable to generate Serial Management Protocol (SMP) commands in which to insert the selected internal operational signals.

10. The integrated circuit of claim 1 wherein:
the external interface comprises a Random Access Memory (RAM) interface, and
the control unit is further operable to insert the selected internal operational signals among the communications by directing the external interface to write the selected signals to a pre-allocated segment of the RAM.

11. The integrated circuit of claim 1 wherein:
the external interface comprises a Peripheral Component Interconnect-Express (PCI-E) protocol compliant interface operable to perform PCI-E communications, and
the control unit is further operable to generate Vendor-Defined Type 1 messages in which to insert the selected internal operational signals.

12. The integrated circuit of claim 1 wherein:
the control unit comprises a First In First Out (FIFO) buffer for temporarily storing the internal operational signals that have been received, and
the control unit is further operable to route signals stored at the FIFO to the external interface.

13. The integrated circuit of claim 1 wherein:
the control unit comprises multiple First In First Out (FIFO) buffers for temporarily storing internal operational signals that have been received, and
the control unit is further operable to utilize multi-buffering techniques at the FIFOs to route stored internal operational signals from the FIFO buffers to the external interface.

14. A method comprising:
generating, at an integrated circuit, internal operational signals for performing designated functions;
selecting, via a control unit of the integrated circuit, the internal operational signals for acquisition via a test signal routing hierarchy of the integrated circuit;
acquiring, via the test signal routing hierarchy, the selected internal operational signals;
selecting, via the control unit of the integrated circuit, an external interface operable to provide communications between the integrated circuit and an external device during normal operation of the integrated circuit; and
applying the selected internal operational signals to the external interface during normal operation of the integrated circuit, wherein applying the selected internal operational signals comprises inserting the selected internal operational signals among the communications provided during normal operation of the integrated circuit.

15. The method of claim 14 wherein:
the designated functions of the integrated circuit are unrelated to testing the internal operations of the integrated circuit,
applying the selected internal operational signals to the external interface does not interrupt the designated functions of the integrated circuit, and
the internal operational signals comprise signals that are routed to the external interface exclusively via the test signal routing hierarchy.

16. The method of claim 14 further comprising:
compressing the selected internal operational signals before inserting them among the communications.

17. The method of claim 14 wherein:
inserting the internal operational signals comprises packaging the internal operational signals inside of a wrapper compliant with a communication protocol utilized by the external interface.

18. The method of claim 14 further comprising:
packaging the selected internal operational signals inserted among the communications by tagging the selected internal operational signals as non-communication content.

* * * * *